(12) United States Patent
Kim

(10) Patent No.: US 7,259,096 B2
(45) Date of Patent: Aug. 21, 2007

(54) METHOD FOR FORMING ALUMINUM INTERCONNECT

(75) Inventor: Jung Joo Kim, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,918

(22) Filed: Dec. 30, 2004

(65) Prior Publication Data

US 2005/0142866 A1    Jun. 30, 2005

(30) Foreign Application Priority Data

Dec. 31, 2003   (KR) .............. 10-2003-0101278

(51) Int. Cl.
*H01L 21/44* (2006.01)

(52) U.S. Cl. .............. 438/688; 438/644; 438/654; 438/656

(58) Field of Classification Search .............. 438/618, 438/688, 656, 654, 653, 652, 648, 644
See application file for complete search history.

(56) References Cited

U.S. PATENT DOCUMENTS

| | | | |
|---|---|---|---|
| 5,008,216 A | 4/1991 | Huang et al. | |
| 5,008,730 A | 4/1991 | Huang et al. | |
| 5,401,675 A | 3/1995 | Lee et al. | |
| 5,403,779 A | 4/1995 | Joshi et al. | |
| 5,627,102 A | 5/1997 | Shinriki et al. | |
| 5,760,475 A | 6/1998 | Cronin et al. | |
| 5,889,328 A | 3/1999 | Joshi et al. | |
| 6,063,703 A | 5/2000 | Shinriki et al. | |
| 6,069,072 A | 5/2000 | Konecni et al. | |
| 6,110,828 A * | 8/2000 | Guo et al. | ........... 438/688 |
| 6,140,228 A | 10/2000 | Shan et al. | |
| 6,169,327 B1 | 1/2001 | Choi et al. | |
| 6,187,667 B1 | 2/2001 | Shan et al. | |
| 6,200,895 B1 | 3/2001 | Givens et al. | |
| 6,309,971 B1 | 10/2001 | Geha | |
| 6,333,261 B1 | 12/2001 | Lin et al. | |
| 6,338,880 B1 | 1/2002 | Akram | |
| 6,522,013 B1 * | 2/2003 | Chen et al. | ........... 257/774 |

(Continued)

FOREIGN PATENT DOCUMENTS

JP    2002-33322    1/2002

(Continued)

OTHER PUBLICATIONS

Likeda Takaaki; Method of Manufacturing Semiconductor Device; Jan. 31, 2002; Patent Abstracts of Japan; Publication No. 2002-033322; Japanese Intellectual Property Office, Japan.

(Continued)

*Primary Examiner*—Douglas M. Menz
(74) *Attorney, Agent, or Firm*—Andrew D. Fortney

(57) ABSTRACT

A method for forming an Al interconnect is disclosed. A disclosed method comprises: depositing a Ti layer on a substrate having predetermined devices; depositing a TiN layer on the entire surface of the Ti layer by performing a CVD process; performing a plasma treatment for the TiN layer; depositing an Al layer on the TiN layer; and forming an ARC on the entire surface of the Al layer.

13 Claims, 2 Drawing Sheets

U.S. PATENT DOCUMENTS

| | | |
|---|---|---|
| 6,531,192 B2 | 3/2003 | Akram |
| 6,534,398 B2 | 3/2003 | Shan et al. |
| 6,627,547 B2 | 9/2003 | Geha |
| 6,656,831 B1 | 12/2003 | Lee et al. |
| 6,756,302 B1 | 6/2004 | Shan et al. |

FOREIGN PATENT DOCUMENTS

| | | |
|---|---|---|
| KR | 2001-0078086 | 8/2001 |

OTHER PUBLICATIONS

Ted Guo and Wei Ti Lee; Method for Plasma-Enhanced Chemical Vapor Deposition of Metal Nitride Layer; Aug. 20, 2001; Korean Patent Abstracts; Publication No. 1020010078086 A; Korean Intellectual Property Office, Republic of Korea.

Partial English translation of foreign patent document believed to be Korean Patent Publication No. 10-1999-6153.

Office Action, Korean Patent Application No. 10-2003-010278; dated Aug. 19, 2005.

* cited by examiner

METHOD FOR FORMING ALUMINUM INTERCONNECT

BACKGROUND OF THE INVENTION

1. Field of the Invention

The present disclosure relates generally to a semiconductor fabrication and, more particularly, to a method for forming an Al interconnect with a TiN layer formed through a chemical vapor deposition process and a plasma treatment.

2. Background of the Related Art

In a semiconductor device fabrication, metallic interconnects are generally made of Al. However, in consideration of the low reliability of Al and the high integration degree of the semiconductor device, multi-layered structure comprising an Al layer and refractory layers such as a Ti layer or a TiN layer is used. That is, the multi-layered structure may comprise a Ti layer 13, a TiN layer 14, an Al layer 12 and an Anti-Reflective Coating 15 (hereinafter referred to as "ARC") made of TiN on a substrate 11 in sequence as shown in FIG. 1a. In addition, another multi-layered structure may comprise a substrate 11, a Ti layer 13, an Al layer 12 and an ARC 15 as shown in FIG. 1b.

In general, because a Chemical Vapor Deposition (hereinafter referred to as "CVD") process does not provide an in-situ process as well as requires high temperature and has a low deposition rate, one of a Physical Vapor Deposition (hereinafter referred to as "PVD") processes such as a sputtering process or an evaporation process has been mainly used to make the multi-layered structures.

Referring to FIG. 1a, both the Ti layer 13 and a TiN layer 14 are sequentially positioned under the Al layer 12. The TiN layer 14 and the Al layer 12 hardly react with each other and, therefore, undesired compound materials which generally have high resistance are not formed between the TiN layer 14 and the Al layer 12. Thus, the initial cross-sectional area of the Al layer 12 is maintained till the end of an interconnect formation process. However, the unreactivity leads to a weak adhesive strength between the Al layer 12 and the TiN layer 14 and, therefore, the Al layer 12 will be easily peeled off from the TiN layer 14. In addition, the [111] crystal growth direction of the Al layer 12 on the TiN layer 14 is much poorer than that of the Al layer 12 on the Ti layer 13. Thus, the poor [111] crystal growth direction of the Al on the TiN layer 14 significantly affects EMs (Electro-Migration), thereby deteriorating the reliability of semiconductor devices. Moreover, when a later cleaning process is performed to remove polymers in resulting interconnects using a predetermined solution, the Ti layer 13 may function as an electrode which causes galvanic corrosions. Furthermore, because the etching rate of the TiN layer 14 is two times lower than that of the Al layer 12, just a thin photoresist is allowed to be formed for a later etching process and, as a result, fine interconnects may be difficult to achieve.

On the other hand, if an Al layer 12 is deposited on an Ti layer 13 as shown in FIG. 1b, the crystal texture of the Al layer 12 grows toward the [111] crystal growth direction. Moreover, the adhesive strength between the Al layer 12 and the Ti layer 13 is enhanced, thereby preventing the Al layer 12 from being peeled off. However, the Ti layer 13 and the Al layer 12 easily react with each other, generating a $TiAl_3$ layer 16 which is 3 times thicker than the Ti layer 13. The thick $TiAl_3$ layer 16 has high resistance and will get even thicker by later processes. Thus, the cross-sectional area of the resulting Al layer 12 is much smaller than the initial design. In addition, voids may be created in the Al layer 12 by the stress due to the pulling of the $TiAl_3$ layer 16.

SUMMARY OF INVENTION

An object of the present invention is to form a TiN layer by performing a CVD process and a plasma treatment, therefore preventing various conventional problems such as the low adhesion of the Al layer and the TiN layer, galvanic corrosions, a need for thin photoresist, undesired $TiAl_3$ layer formation and the decrease of the cross-sectional area of the Al layer.

To achieve these objects and other advantages and in accordance with the purpose of the invention, as embodied and broadly described herein, the present invention provides a method for forming an Al interconnect comprising: depositing a Ti layer on a substrate having predetermined devices; depositing a TiN layer on the entire surface of the Ti layer by performing a CVD process; performing a plasma treatment for the TiN layer; depositing an Al layer on the TiN layer; and forming an ARC on the entire surface of the Al layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

FIGS. 2a through 2d are cross-sectional views illustrating an Al interconnect formation process in accordance with the present invention.

Figure 1A:
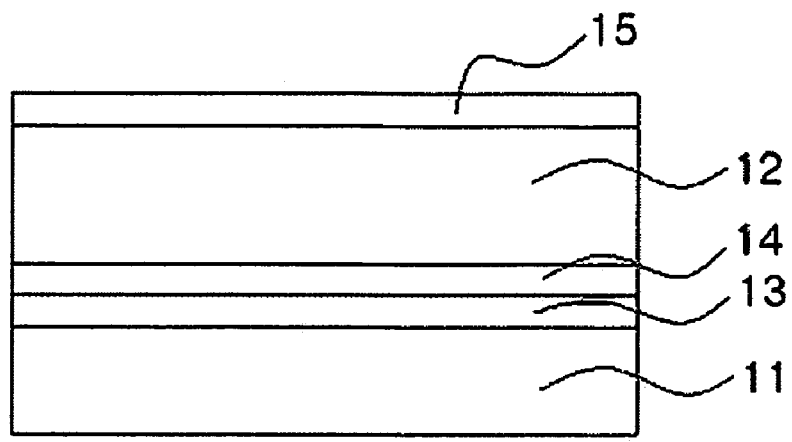
FIGS. 1a and 1b are cross-sectional view illustrating an Al interconnect formation process in accordance with the conventional method.
Figure 1B:
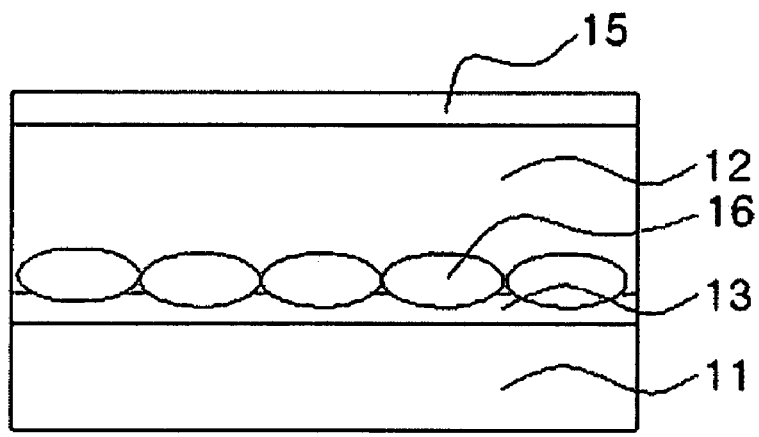
Figure 2A:
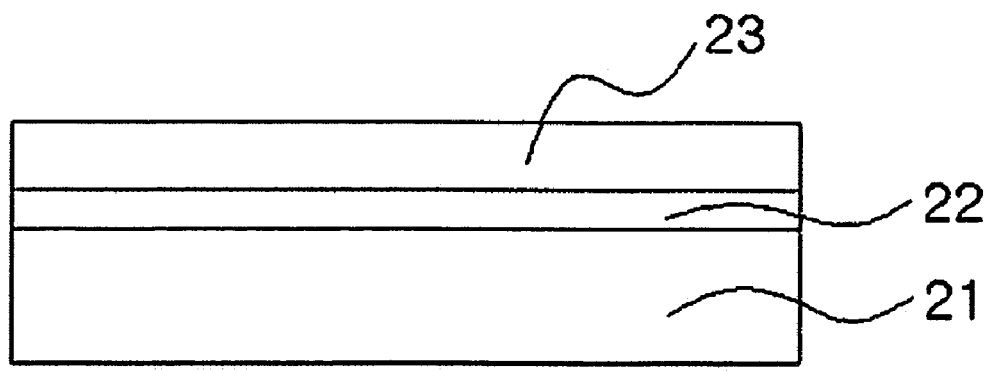
FIGS. 2a through 2d are cross-sectional views illustrating an Al interconnect formation process in accordance with the present invention.

Referring to FIG. 2a, a Ti layer 22 is deposited on a semiconductor substrate 21 having an oxide layer as PMD (Pre-Metallic Dielectric) or IMD (Inter-Metallic Dielectric). A TiN layer 23 is then deposited on the entire surface of the Ti layer 22 by a CVD process. The CVD process is performed under predetermined conditions as follows. The TiN layer 23 is deposited on the Ti layer 22 by a heat treatment. The as-deposited TiN layer 23 has to have a thickness at most 120 Å in consideration of the thickness of the fianl TiN layer 23 formed by a later plasma treatment. In addition, the plasma treatment is performed for the TiN layer 23 so as to make the TiN layer 23 have a high density and remove residues such as carbon. The thickness of the resulting TiN layer 23 has to be less than 60 Å after the plasma treatment. Next, an Al layer is then deposited on the TiN layer 23 of the resulting structure by a hot-cold process such as a sputtering process. The temperature of the hot process is between 300° C. and 450° C. The reason for depositing the thin TiN layer 23 between the Ti layer 22 and the Al layer is that the [111] crystal growth direction of Al layer increases depending on the crystallinity of the Ti layer 23. Accordingly, if the TiN layer 23 is thick, the [111] crystal growth direction of the Al layer may decrease.

Figure 2B:
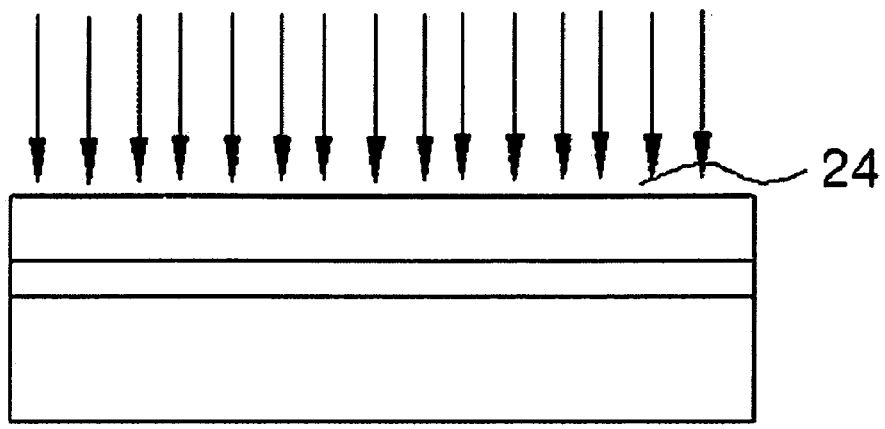

Referring to FIG. 2b, the plasma treatment 24 is performed to make the TiN layer 23 have nano-crystallinity which is similar to an amorphous phase. Thus, the formation of a TiAl$_3$ layer due to the reaction between the Ti layer 22 and the Al layer can be effectively prevented even with the thin TiN layer 23. On the other hand, if the TiN layer 23 is deposited by the conventional PVD process, the TiN layer with a thickness less than 60 Å will have partial unevenness. Moreover, voids are created in the TiN layer 23 due to the pillar-micro structure of the TiN layer 23 if the conventional PVD process is performed. The Ti layer 22 under the TiN layer 23 is diffuse toward the Al layer through the voids and, thereby, the TiAl$_3$ layer is formed in or on the TiN layer 23. However, if the CVD process is performed under a the conditions described above, various conventional problems such galvanic corrosions and needs for thin photoresist can be solved.

Figure 2C:
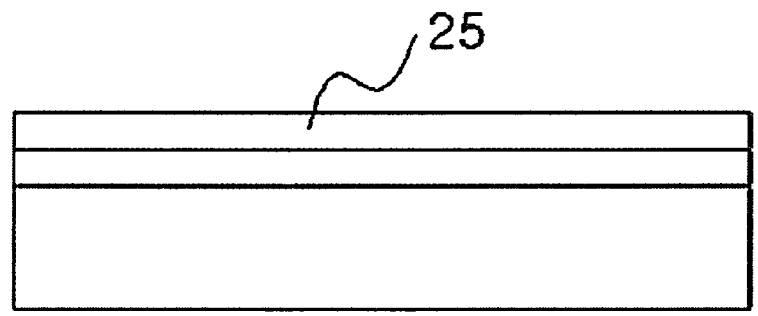

Referring to FIG. 2c, the TiN layer 25 has a thickness less than 60 Å by the plasma treatment.

Figure 2D:
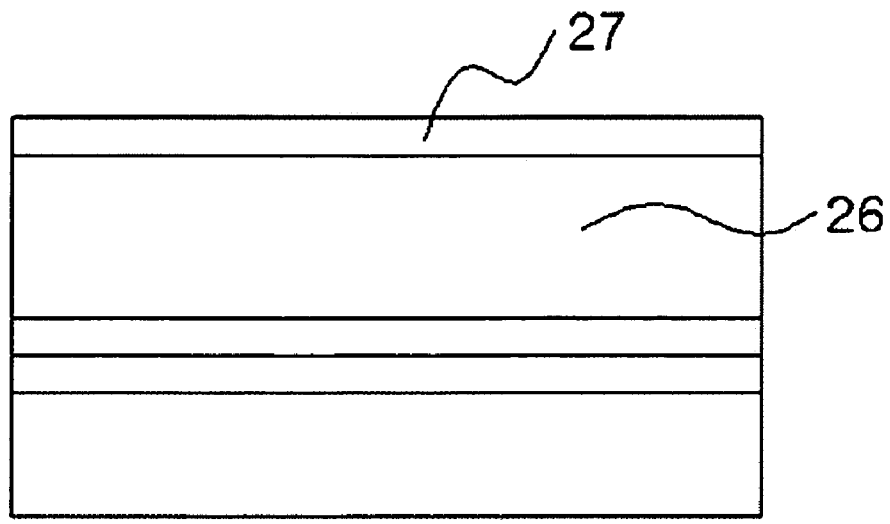

Referring to FIG. 2d, the TiN layer 25 with a thickness less than 60 Å does not affect the crystallinity of the Al layer 26 and has a good adhesive strength. That is, the crystallinity and the adhesive strength can be adjusted by optimizing a plasma treatment time and an energy level of the plasma. Subsequently, an Al interconnect is completed by forming ARC 27 made of TiN on the Al layer 26.

Accordingly, the present invention performs the CVD process and the plasma treatment to form the TiN layer, thereby preventing various conventional problems such as the poor adhesion of the Al layer and the TiN layer, galvanic corrosions, needs for a thin photoresist, the undesired TiAl$_3$ layer formation and the decrease of the cross-sectional area of the Al layer.

It is noted that this patent claims priority from Korean Patent Application Serial Number 10-2003-0101278, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming an Al interconnect comprising the steps of:

depositing a planar Ti layer on a substrate having a completely planar upper surface;

depositing a planar TiN layer on an entire upper surface of the planar Ti layer by chemical vapor deposition (CVD), wherein the deposited TiN layer has a thickness less than 120 Å;

plasma treating the TiN layer, wherein the plasma treated TiN layer has a thickness less than 60 Å;

depositing an Al layer on an entire surface of the plasma treated TiN layer to form the Al interconnect; and forming an ARC on the entire surface of the Al layer.

2. A method as defined by claim 1, wherein the plasma treated TiN layer has nano-crystallinity.

3. A method as defined by claim 1, wherein the Al layer is deposited at a temperature between 300° C. and 450° C.

4. A method as defined by claim 1, wherein the substrate has a flat upper surface.

5. A method as defined by claim 4, wherein the substrate has an oxide layer thereon.

6. A method as defined by claim 5, wherein the oxide layer comprises a pre-metallic dielectric or an inter-metallic dielectric.

7. A method as defined by claim 1, wherein depositing the Al layer comprises sputtering.

8. A method as defined by claim 7, wherein depositing the Al layer comprises a hot-cold process.

9. A method as defined by claim 1, wherein the ARC comprises TiN.

10. A method as defined by claim 1, wherein depositing an aluminum layer comprises depositing a planar aluminum layer.

11. A method as defined by claim 1, wherein the plasma-treated TiN layer has a good adhesive strength to the Al layer.

12. A method as defined by claim 1, wherein the CVD TiN layer has less unevenness than an equivalent TiN layer deposited by physical vapor deposition (PVD).

13. A method as defined by claim 1, wherein the CVD TiN layer prevents formation of a TiAl$_3$ layer due to reaction between the Ti layer and the Al layer, relative to an equivalent TiN layer deposited by physical vapor deposition (PVD).

* * * * *